US012653001B2

(12) United States Patent
Yamazoe et al.

(10) Patent No.: US 12,653,001 B2
(45) Date of Patent: Jun. 9, 2026

(54) METHOD OF MANUFACTURING SEMICONDUCTOR DEVICES AND PATTERN FORMATION METHOD FOR MANUFACTURING SEMICONDUCTOR DEVICES

(71) Applicant: TAIWAN SEMICONDUCTOR MANUFACTURING COMPANY, LTD., Hsinchu (TW)

(72) Inventors: Kenji Yamazoe, San Jose, CA (US); Ping-Chieh Wu, Zhubei City (TW); Hoi-Tou Ng, Hsinchu (TW); Kenneth Lik Kin Ho, Redwood City, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 782 days.

(21) Appl. No.: 17/710,490

(22) Filed: Mar. 31, 2022

(65) Prior Publication Data

US 2023/0005738 A1 Jan. 5, 2023

Related U.S. Application Data

(60) Provisional application No. 63/216,634, filed on Jun. 30, 2021.

(51) Int. Cl.
*H01L 21/027* (2006.01)
*G03F 7/00* (2006.01)

(52) U.S. Cl.
CPC ...... *H01L 21/0275* (2013.01); *G03F 7/70033* (2013.01); *G03F 7/70* (2013.01)

(58) Field of Classification Search
CPC .................................................. H01L 21/0275
See application file for complete search history.

(56) References Cited

U.S. PATENT DOCUMENTS

| | | | | |
|---|---|---|---|---|
| 5,229,872 A | * | 7/1993 | Mumola | G03F 7/70291 |
| | | | | 430/22 |
| 5,523,193 A | * | 6/1996 | Nelson | G03F 7/70283 |
| | | | | 430/311 |
| 8,881,069 B1 | * | 11/2014 | Hamouda | G03F 1/36 |
| | | | | 716/54 |
| 9,507,253 B2 | * | 11/2016 | Ishii | G03F 1/70 |
| 10,990,003 B2 | * | 4/2021 | Hsu | G06F 30/398 |
| 2002/0018599 A1 | * | 2/2002 | Kamon | H01J 37/3023 |
| | | | | 382/280 |

(Continued)

FOREIGN PATENT DOCUMENTS

| | | |
|---|---|---|
| CN | 111727406 A | 9/2020 |
| TW | 201447476 A | 12/2014 |

*Primary Examiner* — William A Harriston
(74) *Attorney, Agent, or Firm* — STUDEBAKER BRACKETT PLLC

(57) ABSTRACT

In a pattern formation method for a semiconductor device fabrication, an original pattern for manufacturing a photomask is acquired, a modified original pattern is obtained by performing an optical proximity correction on the original pattern, a sub-resolution assist feature (SRAF) seed map with respect to the modified original pattern indicating locations where an image quality is improved by an SRAF pattern is obtained, SRAF patterns are placed around the original pattern, the SRAF patterns and the modified original pattern are output as mask data, and the photo mask is manufactured using the mask data.

20 Claims, 14 Drawing Sheets

(56)     References Cited

U.S. PATENT DOCUMENTS

2005/0188341 A1*  8/2005  Fukuhara ................ G03F 7/705
                                                          716/52
2006/0281016 A1*  12/2006  O'Brien .................... G03F 1/36
                                                          716/55
2011/0029937 A1*  2/2011  Kodera .............. G03F 7/70441
                                                          716/52
2012/0096412 A1*  4/2012  Fujimura ............. G06F 30/394
                                                          716/53
2012/0329289 A1*  12/2012  Fujimura .............. B82Y 10/00
                                                          257/E21.328
2013/0185681 A1*  7/2013  Liu .................... G03F 7/70941
                                                          716/51
2013/0227500 A1*  8/2013  Sakajiri .................. G06F 30/00
                                                          716/55
2014/0215416 A1*  7/2014  Sahouria .............. G06F 30/398
                                                          716/53
2014/0223396 A1*  8/2014  Muddu .................. G06F 30/39
                                                          716/55
2014/0229904 A1*  8/2014  Fujimura ............. G03F 7/2063
                                                          716/54
2020/0363713 A1*  11/2020  Hsu ........................... G03F 1/36
2021/0026237 A1   1/2021  Yamazoe et al.
2021/0183656 A1*  6/2021  Lutker-Lee ......... H01L 21/0337

* cited by examiner $$I(x,y) = \sum_i \lambda_i \left| \mathbf{FT}[\Phi_i(f,g)\mathbf{FT}[m(x,y)]] \right|^2$$

TCC: $$TCC(f_1,g_1,f_2,g_2) = \iint S(f,g)P(f+f_1,g+g_1)P^*(f+f_2,g+g_2)dfdg$$

$$= \sum_i \lambda_i \Phi_i(f_1,g_1)\Phi_i^*(f_2,g_2)$$

$$P(f,g) = \text{circ}\left(\sqrt{f^2+g^2}\right)\exp\left[i2\pi\frac{d}{\lambda}\sqrt{n^2-NA^2(f^2+g^2)}\right]\exp[i2\pi W(f,g)]$$

W(f, g): aberration

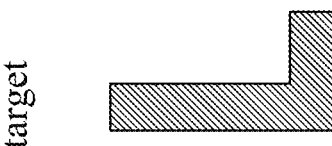
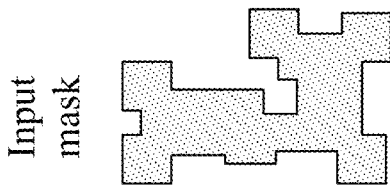
FIG. 4B
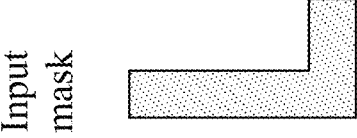
FIG. 4A

Calculate image from mask pattern and a small dot at (x', y')

420

(x', y')

Calculate image from mask pattern only

410

Compare the image slope along the target edge (red line)

If the image slope is improved along the target edge (red line), (x', y') is a good location to place SRAF

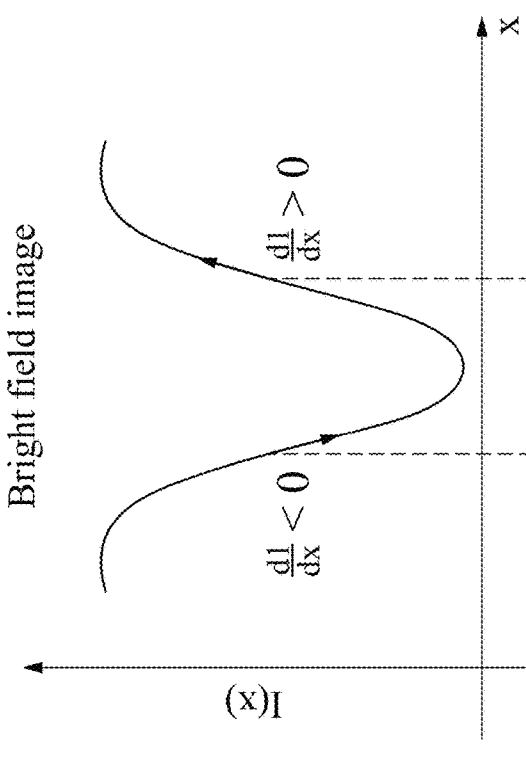
Bright field image
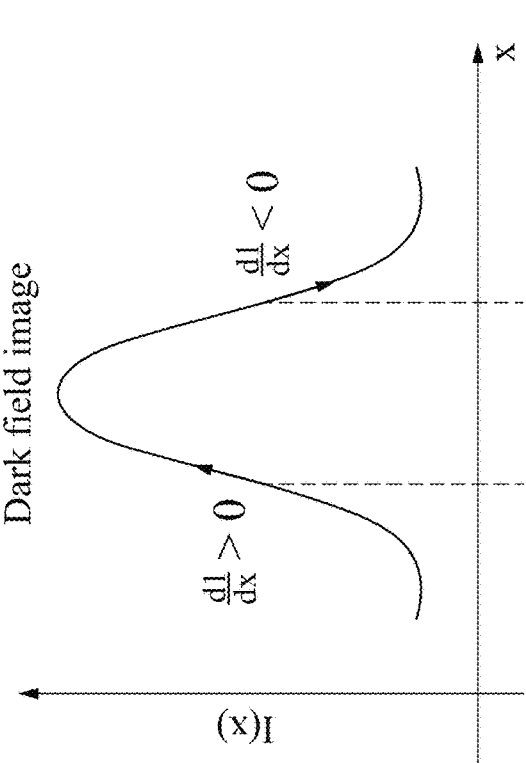
Dark field image
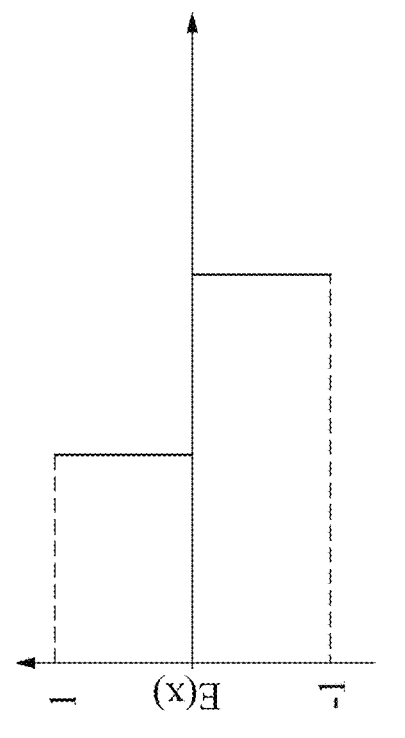
Pattern edge defined in the program
Image slope = E(x) dI/dx
FIG. 5D A little big square mask pattern Target (circle shape contact)

Annular illumination l: 193nm
NA: 1.35
Polarized illumination
Resist thin-film stack
M3D effect applied
Defocus added SRAF seed map SRAF placement

SRAF

50nm contact hole
(input and target)
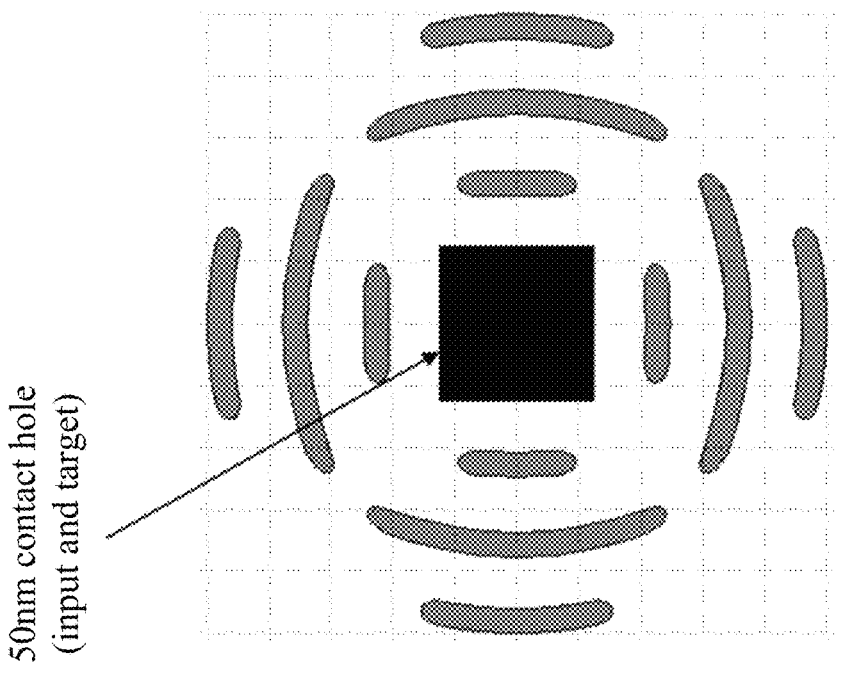
Dark field mask
Illumination
(Annular illumination)
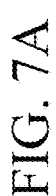
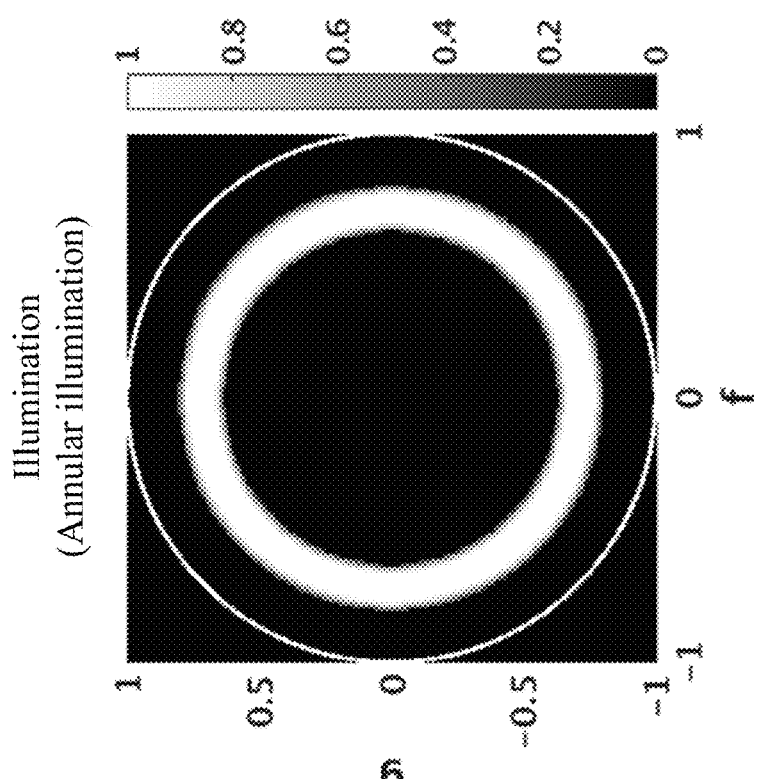
Wavelength: 13.5nm
Na = 0.33
No polarization
Resist thin film stack is used
No aberration
FIG. 7A

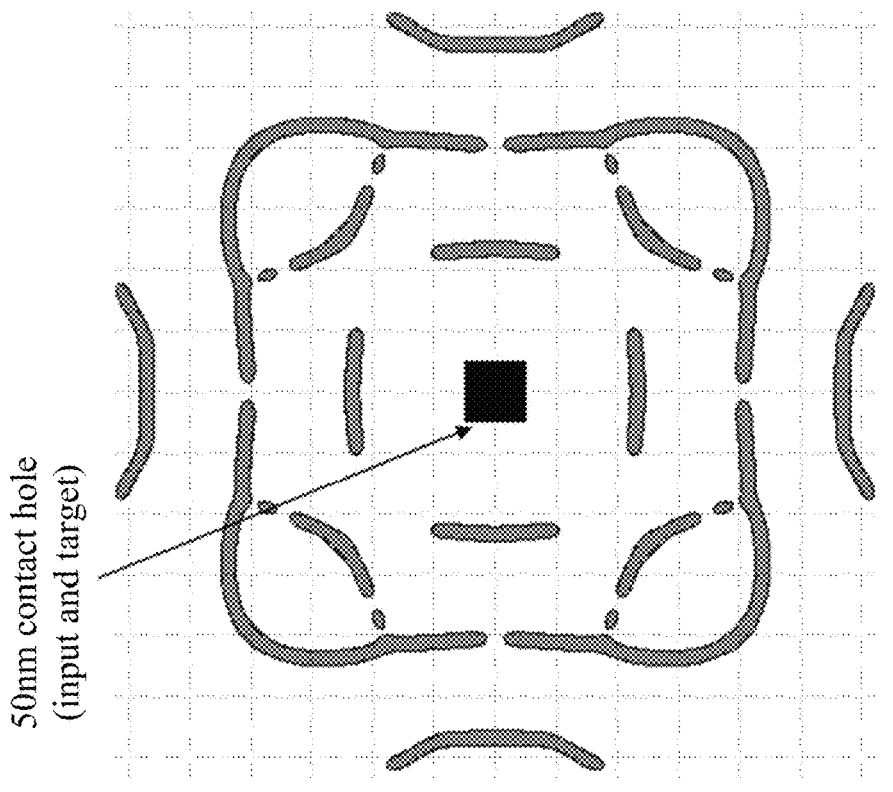
50nm contact hole
(input and target)
Bright field mask
Illumination
(Quadrupole illumination)
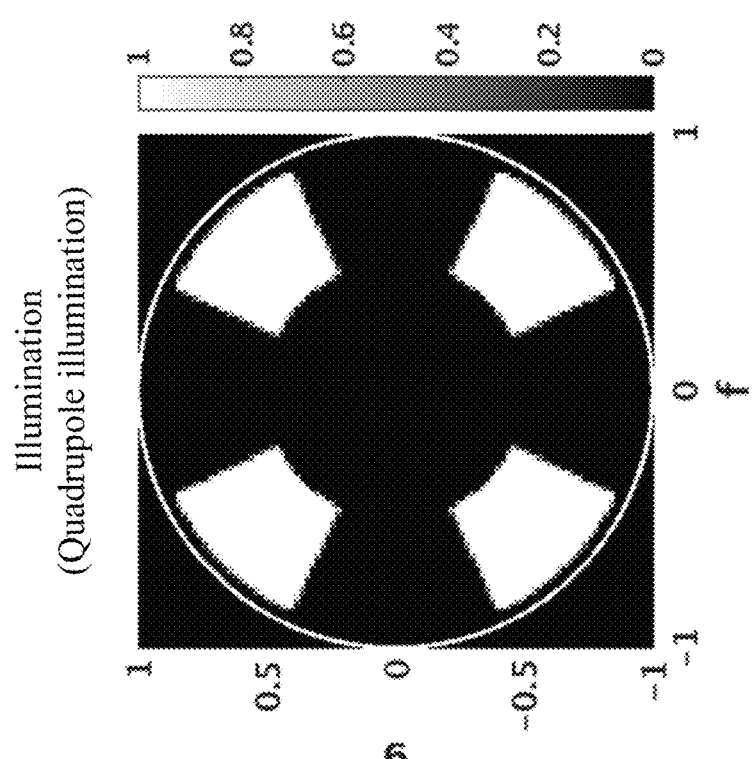
Wavelength: 193nm
Na = 1.35 (water immersion)
TE polarization
Resist thin film stack is used
No aberration
FIG. 7B

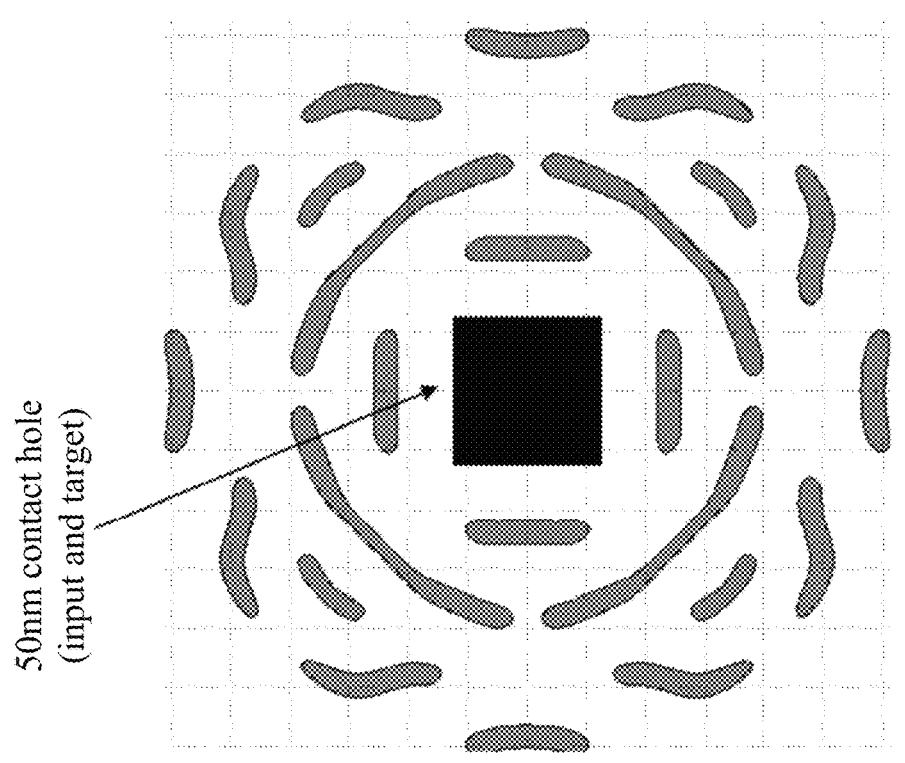
50nm contact hole
(input and target)
Dark field mask
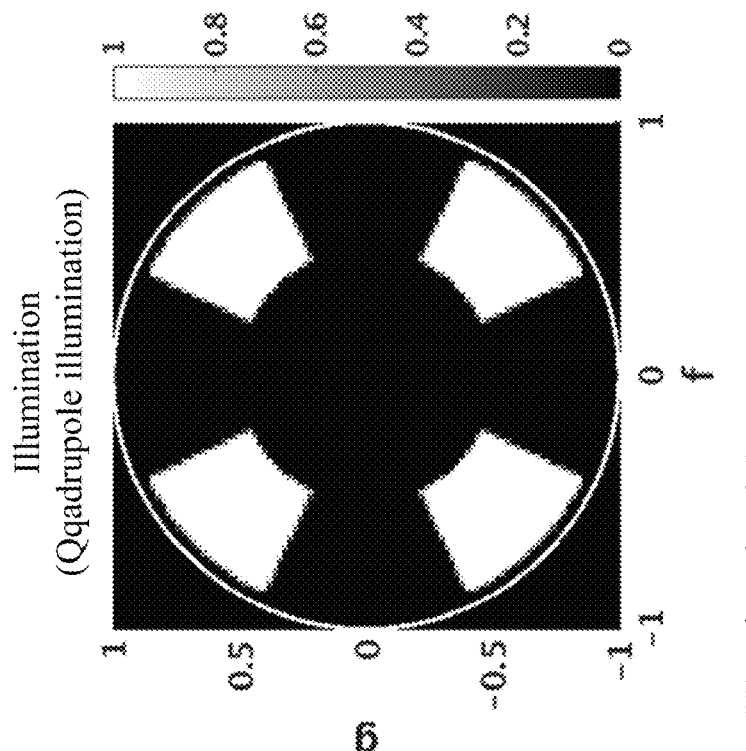
Illumination
(Qqadrupole illumination)
Wavelength: 13.5nm
Na = 0.33
No polarization
Resist thin film stack is used
No aberration
FIG. 7C

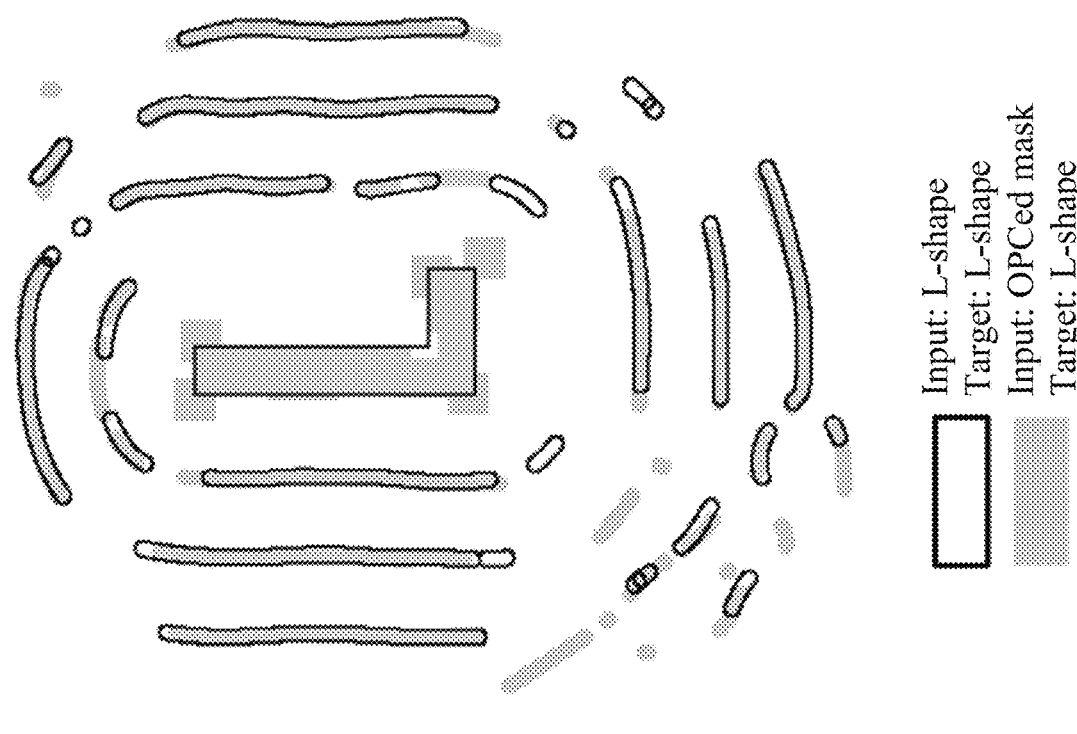
Input: L-shape
Target: L-shape
Input: OPCed mask
Target: L-shape
FIG. 7D
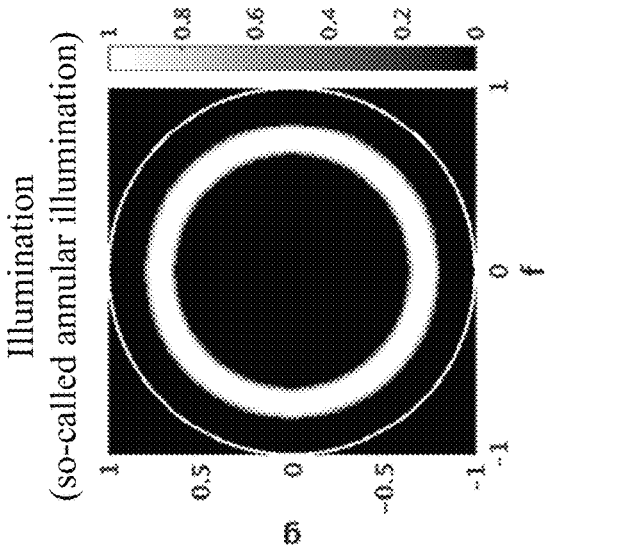
Illumination
(so-called annular illumination)
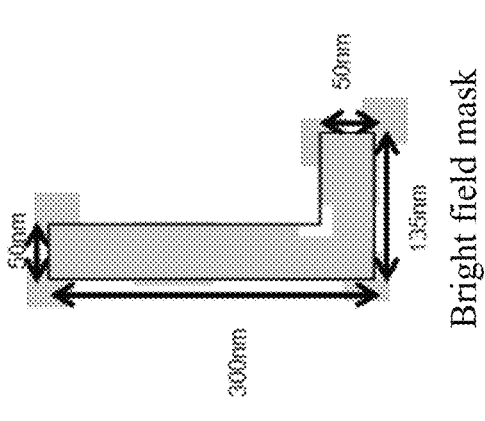
Bright field mask Transmissive mask

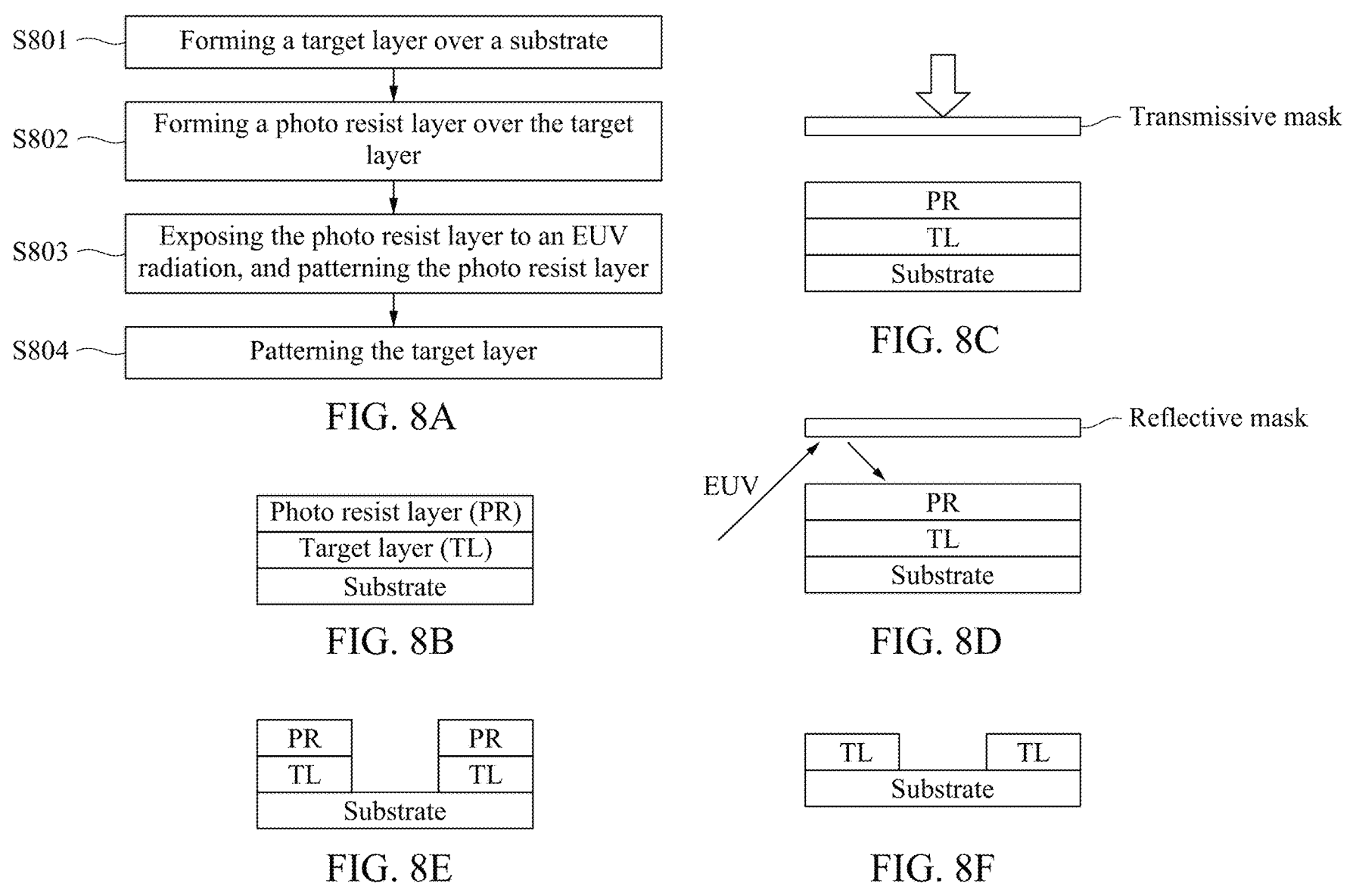

| | |
|---|---|
| PR | |
| TL | |
| Substrate | |

FIG. 8C

Reflective mask

EUV

| | |
|---|---|
| PR | |
| TL | |
| Substrate | |

FIG. 8D

| TL | | TL |
|---|---|---|
| | Substrate | |

FIG. 8F

S801 — Forming a target layer over a substrate

S802 — Forming a photo resist layer over the target layer

S803 — Exposing the photo resist layer to an EUV radiation, and patterning the photo resist layer S804 — Patterning the target layer

FIG. 8A

| Photo resist layer (PR) |
|---|
| Target layer (TL) |
| Substrate |

FIG. 8B

| PR | | PR |
|---|---|---|
| TL | | TL |
| | Substrate | |

FIG. 8E

METHOD OF MANUFACTURING SEMICONDUCTOR DEVICES AND PATTERN FORMATION METHOD FOR MANUFACTURING SEMICONDUCTOR DEVICES

RELATED APPLICATIONS

This application claims the benefit of U.S. Provisional Application No. 63/216,634, filed Jun. 30, 2021, the entirety of which is hereby incorporated by reference herein. Further, the entire contents of U.S. Pat. No. 10,990,002 to Yamazoe et al. is incorporated herein by reference.

BACKGROUND

The electronics industry has experienced an ever-increasing demand for smaller and faster electronic devices to support a greater number of increasingly complex and sophisticated functions. Accordingly, there is a continuing trend in the semiconductor industry to manufacture low-cost, high-performance, and low-power integrated circuits (ICs). Thus far, these goals have been achieved in large part by scaling down semiconductor IC dimensions (e.g., minimum feature size) and thereby improving production efficiency and lowering associated costs. However, such scaling down has also introduced increased complexity to the semiconductor manufacturing process. Thus, the realization of continued advances in semiconductor ICs and devices calls for similar advances in semiconductor manufacturing processes and technology.

As merely one example, scaling down of IC dimensions has been achieved by extending the usable resolution of a given lithography generation by the use of one or more resolution enhancement technologies (RETs), such as phase shift masks (PSMs), off-axis illumination (OAI), optical proximity correction (OPC), and insertion of sub-resolution assist features (SRAFs) into a design layout. Several SRAF insertion or placement techniques have been proposed. Some of them, being rule-based, have relatively short turn-around time but far-from-ideal accuracy. Some of them use numerous iterations of mask optimization to achieve outstanding accuracy but take a long time for each SRAF insertion exercise. Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B show examples of mask patterns according to various embodiments of the present disclosure.

FIGS. 5A, 5B, 5C and 5D show schematic illustrations of obtaining an SRAF seed map according to various embodiments of the present disclosure.

FIGS. 7A, 7B, 7C and 7D show calculated SRAF patterns according to various embodiments of the present disclosure.

FIG. 8A shows a flowchart of a method of making a semiconductor device, and FIGS. 8B, 8C, 8D, 8E, and 8F show a sequential manufacturing operation of a method of making a semiconductor device in accordance with embodiments of present disclosure.

DETAILED DESCRIPTION

Figure 1:
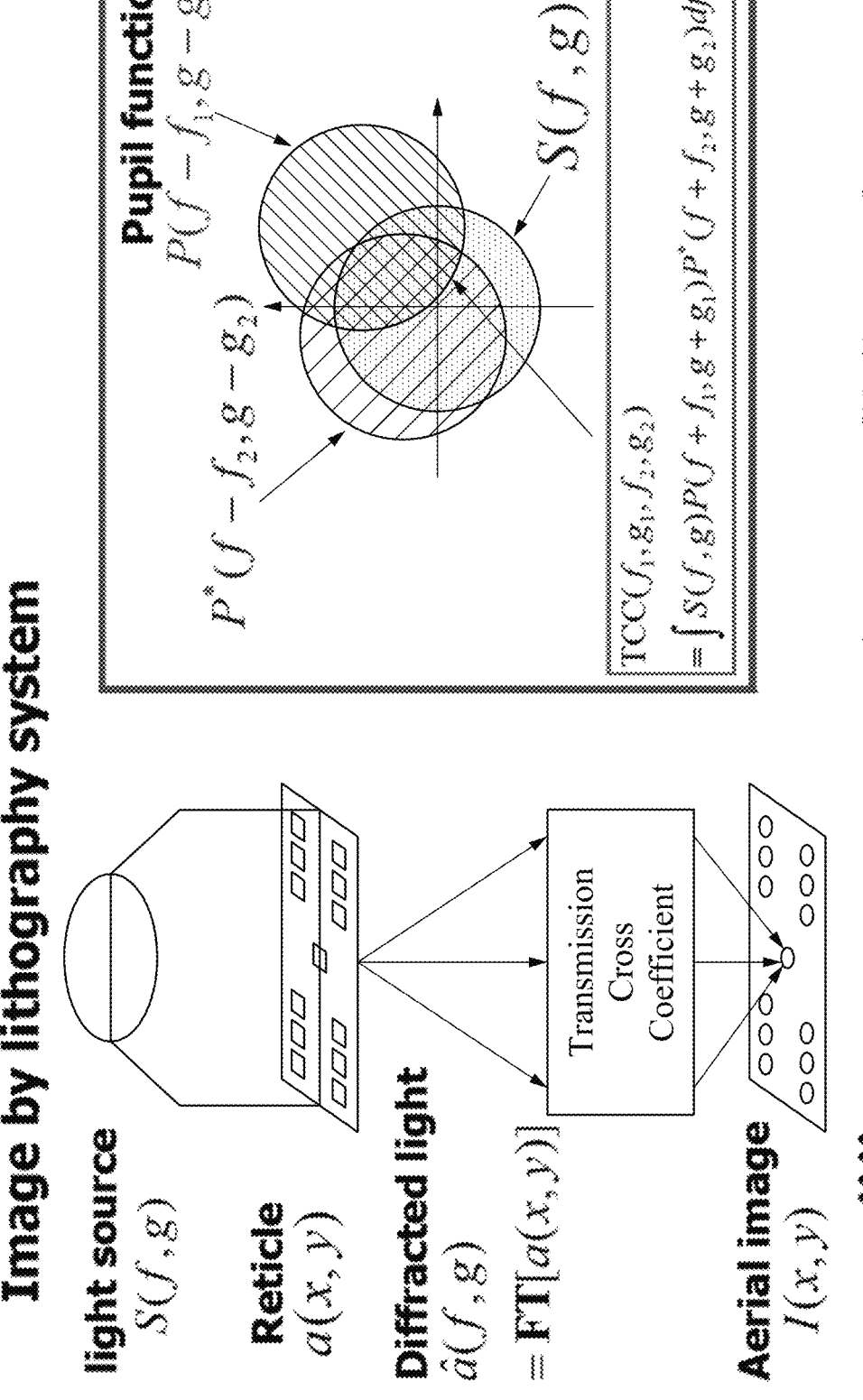
FIG. 1 is a schematic illustration of components of an exposure tool, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In this disclosure, one of A and B means A, B or A and B, and does not mean one from A and one from B, unless otherwise explained.

The present disclosure is generally related to methods of manufacturing a photo mask used in semiconductor device fabrication and manufacturing semiconductor devices, and a mask simulation method, simulation apparatus and a simulation program. More specifically, the present disclosure is related to methods for generating a sub-resolution assist feature (SRAF) seed map for SRAF placement. SRAFs are mask features that are small enough not to be printed over a substrate (wafer) in a photo lithography process (i.e., below the resolution limit of the photo lithography apparatus), but are so shaped and placed on a mask to improve the quality of a lithography image over the substrate. Methods to determine the shapes and positions of SRAFs are thereof of heightened interest. With respect to placement of SRAFs, several SRAF placement techniques have been proposed. For example, one of the SRAF placement techniques is a rule-based SRAF placement method. In this method, numerous test patterns and corresponding wafer images are obtained to populate empirical data and the empirical data is studied and analyzed to establish the rules. SRAFs are then placed on a mask based on such rules. Because SRAFs are placed based on a rule table, the turn-around-time is short. However, because the test patterns may not be representative of the actual patterns, the rule-based SRAF placement techniques may suffer from unsatisfactory accuracy.

Another SRAF placement technique is inference mapping lithography (IML). A real-world exposure tool uses a partially coherent radiation source and the partial coherence may be decomposed into a sum of coherent systems (SOCS) by performing decomposition on the transmission cross coefficient (TCC). In terms of optical physics, the TCC represents autocorrelation of the radiation source of the exposure tool with the projection pupil of the exposure tool. Therefore, the TCC is a mathematical representation of the imaging capability of the exposure tool, which includes an ensemble of various exposure conditions of the exposure tool. The TCC may be decomposed into a set of eigenfunctions ($\Phi$) and a set of eigenvalues ($\lambda$). IML only considers the first order eigenfunction of the TCC to determine SRAF placement. Because only the first order eigenfunction is included in IML, the effect of exposure conditions of the exposure tool may not be sufficiently factored and accuracy may be less than satisfactory.

Still another SRAF placement technique is called inverse lithography technology (ILT). ILT received its name due to its approach to lithography in an inverse fashion. Instead of calculating the aerial image based on a given mask design, it calculates a mask design necessary to generate a target aerial image. Although ILT may have superior accuracy, its turn-around-time may be unduly long and intractable. In some instances, ILT may require more than 300 times of the amount of time needed to conclude a rule-based SRAF placement process. That is why ILT is currently mostly used to perform spot repairs of mask.

The present disclosure put forth methods of semiconductor device fabrication where the placement of SRAFs includes better consideration of exposure conditions of the exposure tool and influence due to mask 3D effect. Methods according to embodiments of the present disclosure consider exposure conditions of the exposure tool, including illumination intensity of the exposure tool, a numerical aperture of the exposure tool, a depth of focus (DOF), a thickness of a resist stack to be patterned, and/or a range of an aberration. In addition, methods of the present disclosure may include diffraction components to address polarization due to a mask three-dimensional (3D) effect. Because of the consideration of the exposure conditions and the mask 3D effect, methods of the present disclosure have better accuracy than the aforementioned rule-based SRAF placement techniques and IML techniques.

IC manufacturing includes multiple entities, such as a design house, a mask house, and an IC manufacturer (i.e., a fab). These entities interact with one another in the design, development, and manufacturing cycles and/or services related to manufacturing an integrated circuit (IC) device. These entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house, mask house, and IC manufacturer may have a common owner, and may even coexist in a common facility and use common resources. In various embodiments, the design house, which may include one or more design teams, generates an IC design layout. The IC design layout may include various geometrical patterns designed for the fabrication of the IC device. By way of example, the geometrical patterns may correspond to patterns of metal, oxide, or semiconductor layers that make up the various components of the IC device to be fabricated. The various layers collectively form various features of the IC device. For example, various portions of the IC design layout may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house implements a design procedure to form the IC design layout. The design procedure may include a logic design, a physical design, and/or a place and route. The IC design layout may be presented in one or more data files having information related to the geometrical patterns, which are to be used for fabrication of the IC device. In some examples, the IC design layout may be expressed in a graphic design system (GDS)-II file format or design framework (DF)-II file format.

In some instances, the design house may transmit the IC design layout to the mask house, for example, via the network connection described above. The mask house may then use the IC design layout to generate a mask design, such as the first mask design, modify the mask design to form a modified mask design, and manufacture one or more masks to be used for fabrication of the various layers of the IC device according to the modified mask design. In various examples, the mask house performs mask data preparation, where the IC design layout is translated into a form that can be physically written by a mask writer, and mask fabrication, where the design layout prepared by the mask data preparation is modified to generate a modified mask design and is then fabricated. In some embodiments of the present disclosure, some of the operations described above are not performed by the mask house, but the IC manufacturer, especially when information of the exposure tool is used.

FIG. 1 illustrates major component planes in an exposure tool (or lithography system). The exposure tool (e.g., an optical stepper and an optical scanner) includes a radiation source (light source), a photo mask (reticle), a pupil plane, and an aerial image on a wafer/substrate. The radiation source (or light source) may be expressed as a function S (S(f, g)), where f and g are coordinates on a plane at the radiation source. The reticle (or the photo mask) may be expressed as a function a(x, y) (or m(x, y)), where x and y are coordinates on a plane at the photo mask. Light (radiation) diffracted by features on the photo mask may be expressed as a Fourier Transform of the mask function: â(f, g)=FT[a(x, y)]. At the pupil plane, a pupil function is represented as a function of P, P(f, g). A complex conjugate of the pupil function is given by a function of P*(f, g). The transmission cross coefficient TCC is obtained by:

$$TCC(f_1, g_1, f_2, g_2) = \iint S(f,g)P(f+f_1, g+g_1)P^*(f+f_2, g+g_2)\, df\, dg$$

The aerial image I (x, y) is given by:

$$I(x, y) = \iiiint TCC(f_1, g_1, f_2, g_2) \, â(f_1, g_1)â^*(f_2, g_2)e^{-i2\pi[(f1-f2)x+(g1-g2)y]}df_1\, dg_1\, df_2\, dg_2$$

In some embodiments, the radiation of the exposure tool may be polarized and the polarization may be changed by the mask. For example, the radiation of the exposure tool incident on the mask may be polarized in the X direction and the light diffracted by the mask may be polarized in the Y direction at the pupil. With respect to such a near field incoming and outgoing radiation pair, the first mask function includes an X-Y component ($a^{1zy}(x, y)$) and the X-Y component represents a simulated interaction between the X-polarized radiation on the mask and the Y-polarization radiation on the pupil. Similarly, with respect to the X-polarized incident radiation and X-polarized outgoing radiation, the first mask function includes an X-X component ($a^{1xx}(x, y)$); with respect to the Y-polarized incident radiation and X-polarized outgoing radiation, the first mask function includes a Y-X component ($a^{1yx}(x, y)$); and with respect to the Y-polarized incident radiation and Y-polarized outgoing radiation, the first mask function includes a Y-Y component ($a^{1yy}(x, y)$). In cases where the mask design is assumed to be implemented as an ideal mask, the X-X, X-Y, Y-X, and Y-Y components are identical to one another. In cases where the first mask design 202 is assumed to be implemented as a real-world mask with mask three-dimensional (3D) effect, the X-X, X-Y, Y-X, and Y-Y components are not identical and should be considered separately.

Although FIG. 1 shows a transmission type photo mask used in, for example, a KrF or an ArF excimer laser lithography system (optical scanner/stepper), an extreme ultraviolet (EUV) lithography system using a reflective photo mask can also be expressed by the same equations.

In the above lithography model, various parameters including, but not limited to, a wavelength of the light source, a numerical aperture (NA) of the optical system, information regarding illumination (e.g., illumination shapes such as annular illumination, multipole illumination, etc.), information regarding lens aberration, information regarding polarization of the light, information regarding a film stacking structure on which a photo resist layer is formed, information regarding a mask three-dimensional (3D) effect, and information regarding the photo resist layer are specified.

Figure 2:
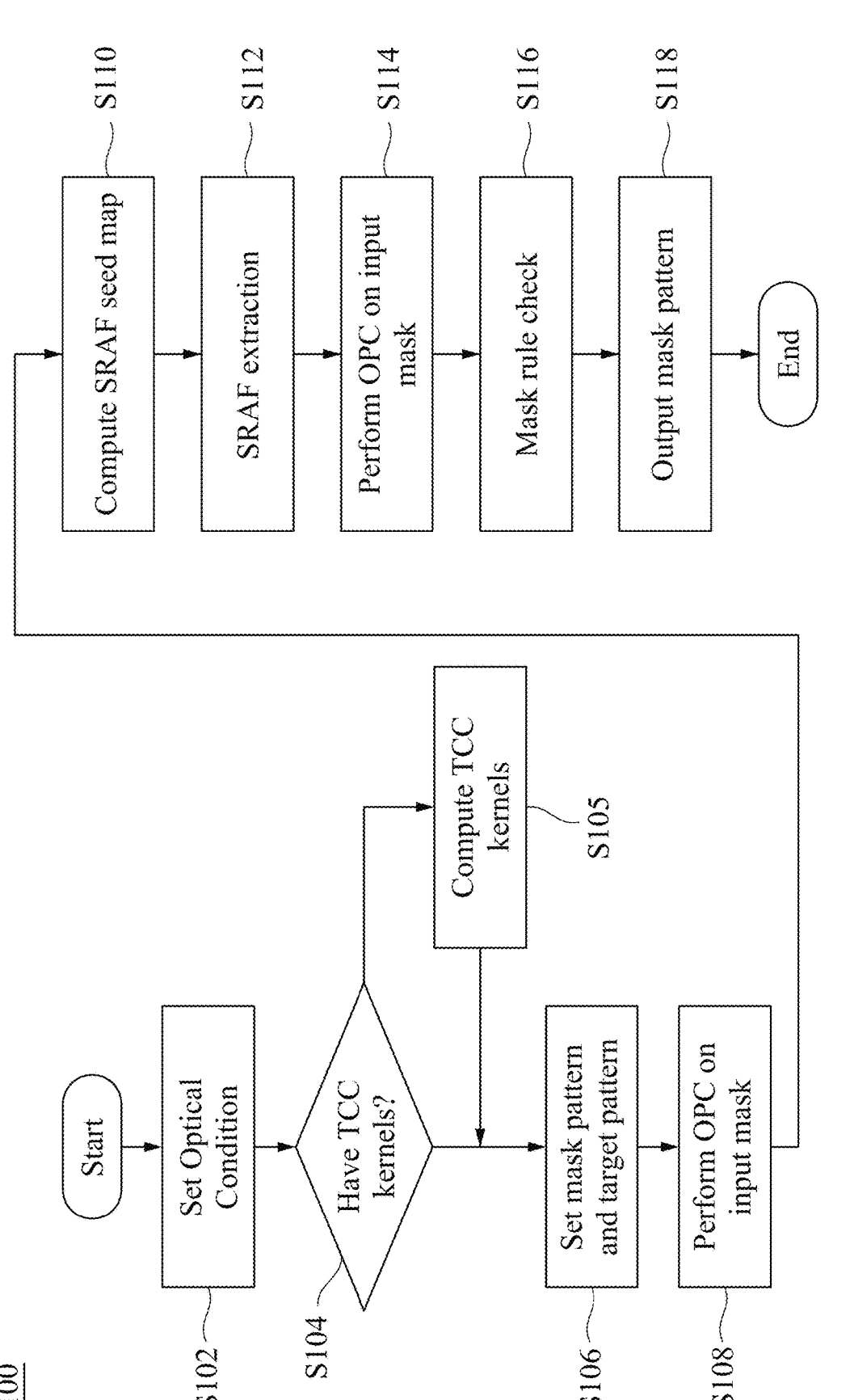
FIG. 2 is a flow chart of an embodiment of a method of manufacturing a photomask according to various aspects of the present disclosure.

FIG. 2 is a flow chart of a sequential operation 100 of manufacturing a photo mask used for semiconductor device fabrication according to an embodiment of the present disclosure. It is understood that additional operations can be provided before, during, and after processes shown in FIG. 2, and some of the operations described below can be replaced or eliminated, for additional embodiments of the method. The order of the operations/processes may be interchangeable.

Referring now to FIG. 2, the operation 100 includes a block S102 where optical conditions (parameters) of the lithography tool are set. In some embodiments, one or more of the parameters as set forth above are specified. In some embodiments, the lithography tool includes a deep ultraviolet (DUV) exposure tool with a DUV radiation sources (such as KrF excimer laser or ArF excimer laser) or an extreme ultraviolet (EUV) exposure tool with an EUV radiation sources (such as a tin droplet laser plasma EUV generation). In some embodiments, the exposure tool may be a DUV exposure tool with immersion lithography capabilities. Unless the configuration of the exposure tool is intentionally or inadvertently changed, the set of exposure conditions is generally unique to the exposure tool, except for the information about photo resist and film structure.

At block S104 of FIG. 2, it is determined whether a calculated kernel exists for a given set of the optical conditions. If the answer is yes, the operation proceeds to block S106. If the answer is no at S104, the kernel is calculated at block S105 as described below.

Figure 3:
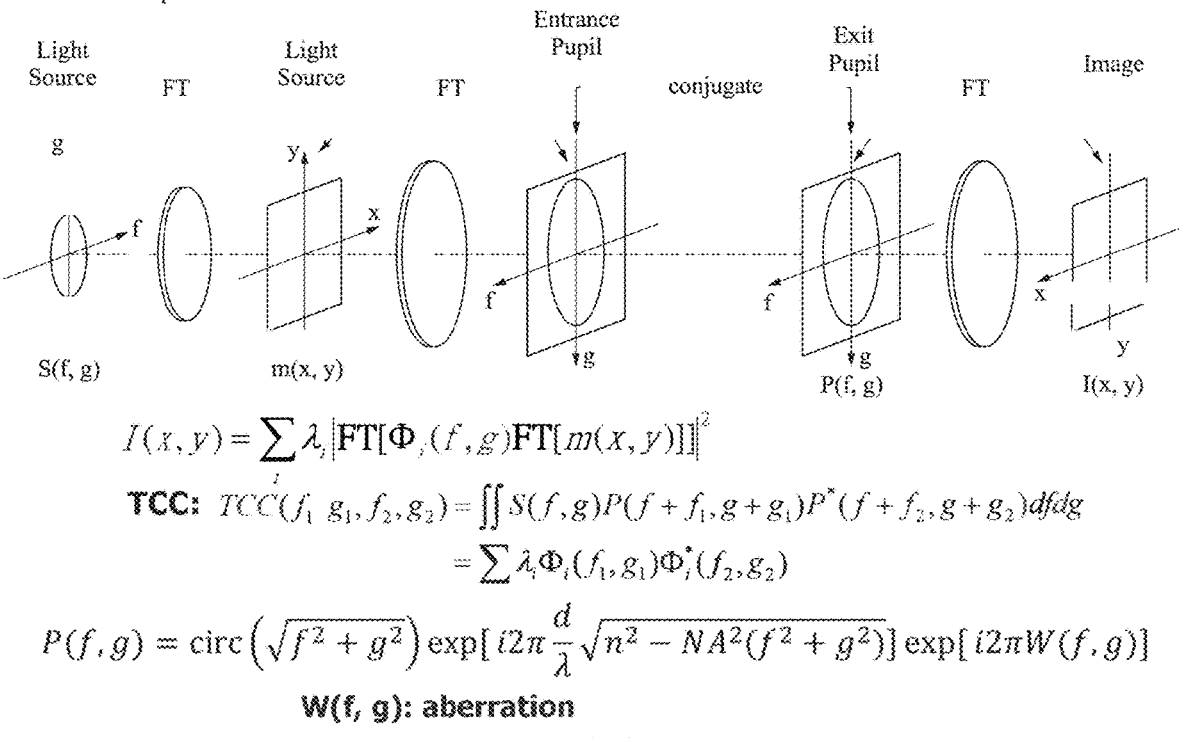
FIG. 3 is a schematic illustration of components of an exposure tool, according to various aspects of the present disclosure.

FIG. 3 shows a diagram of calculating TCC kernels according to embodiments of the present disclosure. As explained with respect to FIG. 1, the TCC kernel is calculated from the radiation source function S(f, g), a pupil functions P(f, g) and a complex conjugate of the pupil function P*(f, g). In some implementations, the TCC may be decomposed into a plurality orders of eigenvalues (each of which may be represented as $\lambda_i$, where i denotes i-th eigenvalue of the TCC) and a plurality orders of eigenfunctions $\Phi$ (each of which may be represented as $\Phi_i$, where i denotes i-th eigenfunction of the TCC). In some embodiments, there are N eigenfunctions and N eigenvalues, where N is an integer and may be between 1 and the number of point sources in the light source. Thus, the TCC kernel can be expressed in Mecer expansion as below:

$$TCC(f_1, g_1, f_2, g_2) = \int \int S(f, g)P(f + f_1, g + g_1)P^*(f + f_2, g + g_2)dfdg$$
$$= \sum_i \lambda_i \Phi_i(f_1, g_1)\Phi_i^*(f_2, g_2)$$

Further, the pupil function P(f, g) is expressed as follows:

$$P(f, g) = circ\left(\sqrt{f^2 + g^2}\right)\exp\left[i2\pi\frac{d}{\lambda}\sqrt{n^2 - NA^2(f^2 + g^2)}\right]\exp[i2\pi W(f, g)]$$

where W(f, g) expresses lens aberration, "d" is defocus amount and NA is numerical aperture. Then, the optical image I(x, y) on the wafer is expressed by:

$$I(x, y) = \sum_i \lambda_i|FT[\Phi_i(f, g)FT[m(x, y)]]|^2,$$

where m(x, y) is a mask function, also described as a(x, y) interchangeably.

Then, at block S106 of FIG. 2, an original mask pattern (input mask) is acquired. In some embodiments, a target shape of the pattern is also acquired. In some embodiments, the target pattern shape is identical to the original pattern shape, and in other embodiments, the target pattern shape is different from the original pattern considering CD (critical dimension) tolerance.

FIG. 4A shows an example of the original mask pattern (L-shape) and the target pattern shape according to an embodiment of the present disclosure. In some embodiments, at block S108 of FIG. 2, an optical proximity correction (OPC) operation is performed on the original mask pattern. In the OPC operation, edges and/or segments of edges are moved inwardly or outwardly according to optical proximity effect caused by the pattern by itself and/or surrounding patterns.

FIG. 4B shows an example of the mask pattern after the OPC operation and the target pattern shape according to an embodiment of the present disclosure. In some embodiments, the OPC operation is optional. In other embodiments, an OPCed mask pattern is acquired as an original mask pattern, and in such a case, no OPC at block S108 is performed.

Figure 5A:
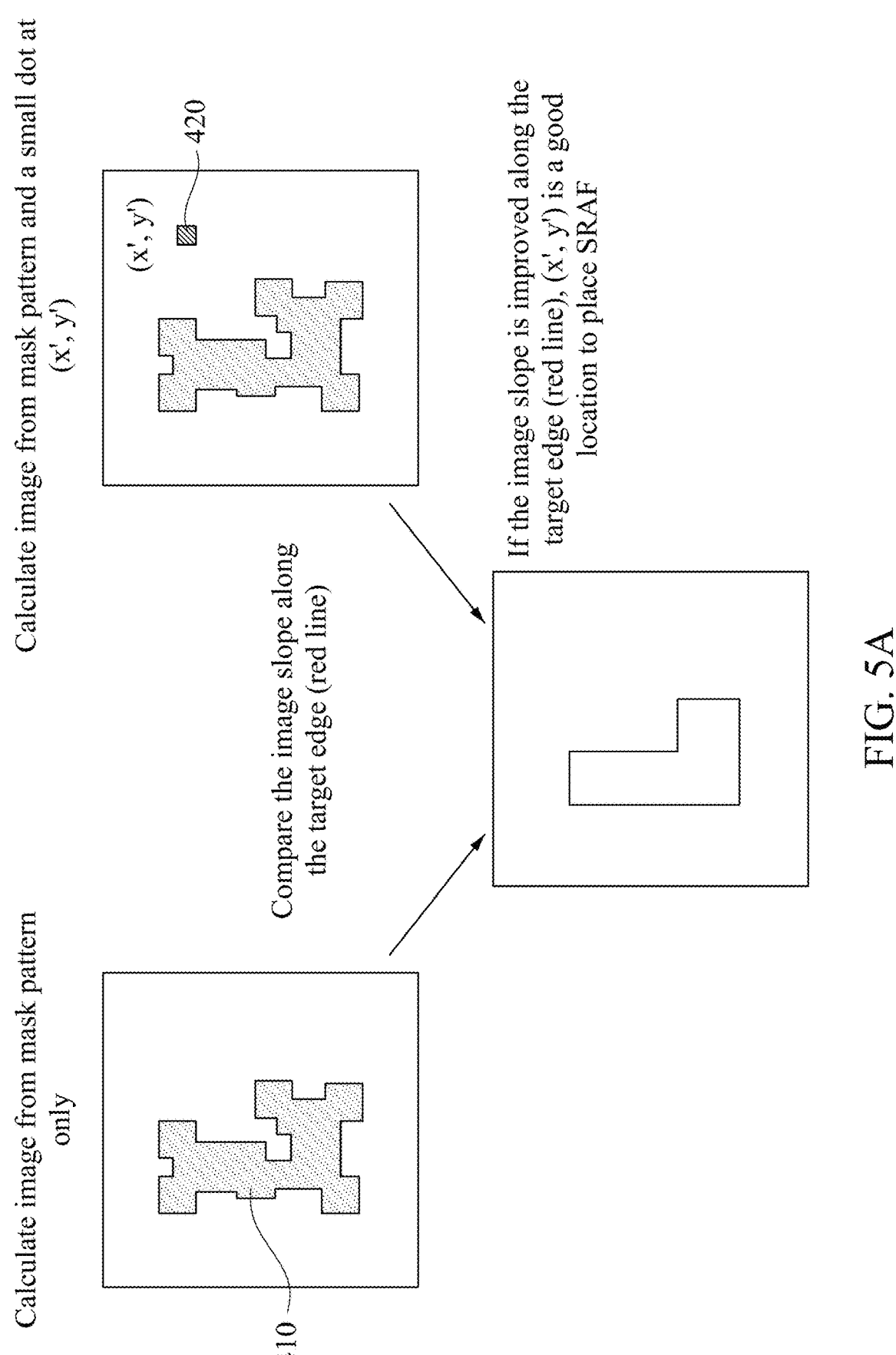

Then, at block S110 of FIG. 2, a SRAF seed map is generated. FIG. 5A shows a conceptual diagram and FIG. 5B shows a flow chart of calculating a SRAF seed map.

Figure 5C:
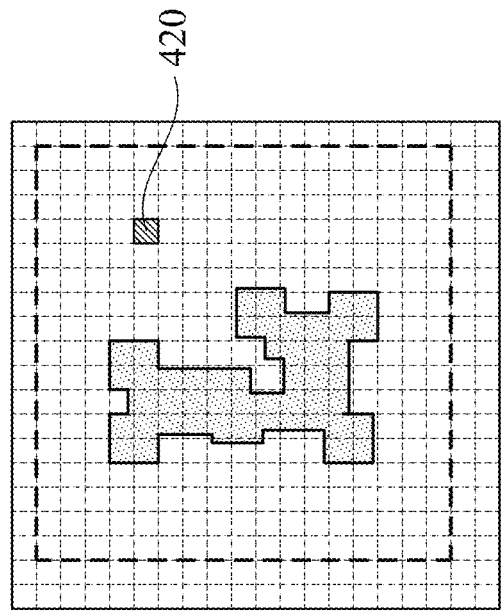
Figure 5B:
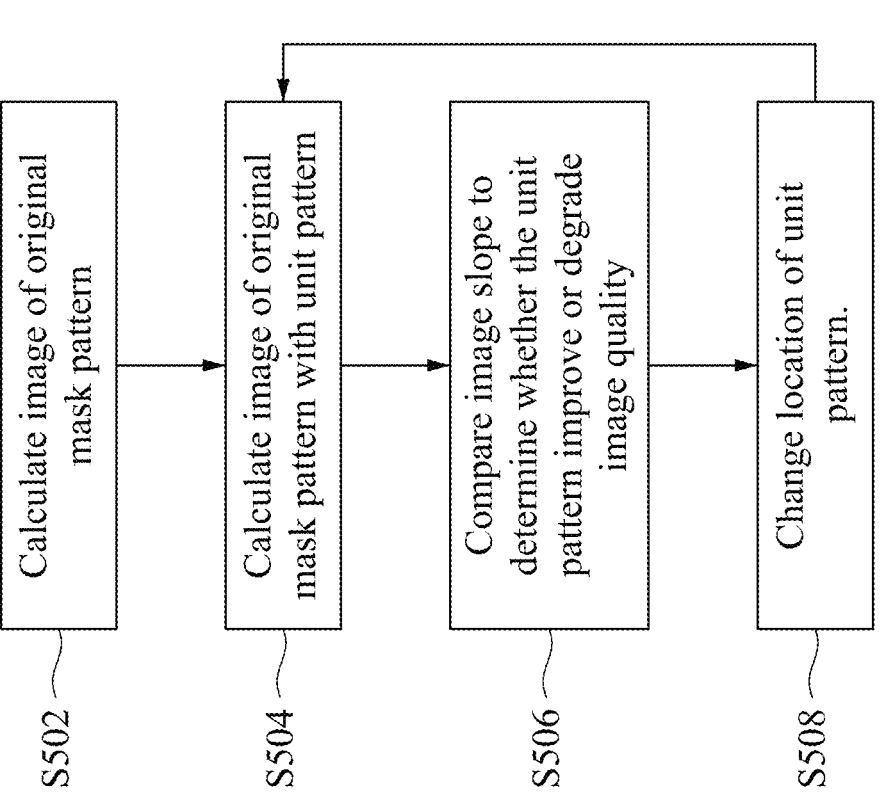

In some embodiments, an optical image of the original mask pattern 410 with OPC is calculated by using the TCC kernel for the given lithography tool at block S502 of FIG. 5B. More specifically, the SRAF seed map is determined by convoluting the mask function ($a^1(x, y)$) representing the original mask pattern and the TCC kernel. As described above, the mask function includes an X-Y component ($a^{1xy}$ (x, y)), an X-X component ($a^{1xx}$(x,yy)), a Y-X component ($a^{1yx}$(x, y)), and a Y-Y component ($a^{1yy}$(x, y)). The i-th eigenfunction of the TCC that interacts with ($a^{1xx}$(x, y)) is defined as $\varphi_i^{xy}$(x, y), the i-th eigenfunction of the TCC that interacts with ($a^{1xy}$(x, y)) is defined as $\varphi_i^{xy}$(x, y) the i-th eigenfunction of the TCC that interacts with ($a^{1yx}$(x, y)) is defined as $\varphi_i^{yx}$(x, y), and the i-th eigenfunction of the TCC that interacts with ($a^{1yy}$(x, y)) is defined as $\varphi_i^{yy}$(x, y).

Then, a small dot pattern (a unit pattern) 420 is placed at a (x', y') locatioi around the original mask pattern 410 as shown in FIG. 5A, and an optical image of the original mask pattern 410 and the unit pattern 420 is calculated by using the TCC kernel at block S504 of FIG. 5B.

Then, at block S506, the optical image of the original mask pattern 410 only and the optical image of the combination of the original mask pattern 410 and the unit pattern 420 are compared to determine if the unit pattern improves the quality of the optical image of the original mask pattern. When the unit pattern improves the quality of the optical image of the original mask pattern, the amount of improvement is indicated as a positive value in the SRAF seed map, and when the unit pattern degrades the quality of the optical image of the original mask pattern, the amount of degradation is indicated as a negative value in the SRAF seed map in some embodiments.

In some embodiments, the quality of the optical image is a slope of the optical image at the edge of the pattern, and the image slopes along the target edge are compared. FIG. 5D shows how to determine image slope E(x). If the image slope is improved along the target edge, the location a (x', y') is determined as a good location to place a SRAF. In some embodiments, the slope is an image log slope (ILS). In other embodiments, the quality of the optical image is a contrast, an intensity, and/or a focus tolerance (depth of focus). More than one of the qualities of the optical image is used to generate the SRAF seed map.

Then, at block S508, the location of the unit pattern is changed and the calculation of an optical image at block S504 and the comparison at block S506 are repeated to find good locations for placing the SRAF patterns. The repetition of placing the unit pattern and the comparison is performed for a given region around the original pattern in some embodiments.

In some embodiments, the placement of the unit pattern is performed according to a mesh or a matrix surrounding the original pattern as shown in FIG. 5C. In some embodiments, the dimension of the mesh (one square) is in a range from about 2 nm to about 40 nm (on wafer). The overall calculation area for the unit pattern is an area distanced L from the original pattern in some embodiments. In some embodiments, the distance L is in a range from about 100 nm to about 1,000 nm. If the distance between the given pattern and the adjacent pattern is smaller than L, the calculation of the image for the unit pattern is performed for the area between the given pattern and the adjacent pattern in some embodiments.

In some embodiments, the SRAF seed map t(x', y') can be calculated by using the following equations:

$$t(x', y') = \int\int [I_x(x, y; x', y') + I_y(x, y; x', y')] dx dy,$$

where $$FT[I_x(x, y; x', y')] =$$

$$FT\left[h(x, y)\frac{\partial W(x, y)}{dx}\right][i2\pi f \Phi_i(f, g)]^* + FT\left[h_x(x, y)\frac{\partial W(x, y)}{dx}\right]\Phi_i^*(f, g),$$

$$FT[I_y(x, y; x', y')] =$$

$$FT\left[h(x, y)\frac{\partial W(x, y)}{dy}\right][i2\pi g \Phi_i(f, g)]^* + FT\left[h_y(x, y)\frac{\partial W(x, y)}{dy}\right]\Phi_i^*(f, g),$$

$$h(x, y) = FT^{-1}[\Phi_i(f, g)\hat{a}(f, g)],$$

$$h_x(x, y) = FT^{-1}[i2\pi f \Phi_i(f, g)\hat{a}(f, g)],$$

$$h_y(x, y) = FT^{-1}[i2\pi g \Phi_i(f, g)\hat{a}(f, g)],$$

$\lambda_i$ is the i-th eigenvalue of TCC, $\Phi_i$ is the i-th eigenfunction of the TCC, and $\Phi_i = FT[\varphi_i]$.

By applying the above equations, a SRAF seed map for a target pattern for a given lithography tool can be calculated. In some embodiments, the target pattern includes a plurality of patterns. The plurality of patterns are for contact (via) holes of a standard cell structure of a logic circuit, or a memory device, in some embodiments. In other embodiments, the plurality of patterns are for wiring patterns of a logic circuit.

Figures 6A, 6B, 6C, 6D:
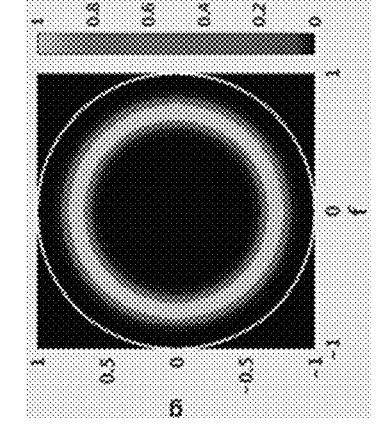
FIGS. 6A, 6B, 6C and 6D show calculated SRAF seed map and SRAF patterns according to an embodiment of the present disclosure.

FIGS. 6A-6D show calculation of a SRAF seed map and SRAF patterns placed according to the SRAF seed map in accordance with an embodiment of the present disclosure. In this embodiment, the original mask pattern is a square and the target shape is circle as shown in FIG. 6A. No OPC is applied to the original shape. As shown in FIG. 6B, the parameters of the lithography tool are: a wavelength of the source radiation=193 nm; a numerical aperture=1.35; polarized illumination; an annular illumination; and defocus is applied. The parameters also include application of a mask 3D effect, and a photo resist stack structure. The original mask pattern is a 50 nm square island pattern (a hole pattern in a bright field).

By applying the aforementioned equations to the original pattern, a SRAF seed map is calculated as shown in FIG. 6C (S110 of FIG. 2). In the SRAF seed map, bright lines indicate locations at which the image quality (e.g., image slope along the edges of target shape) is improved.

As shown in FIG. 6C, an SRAF seed map includes information useful for SRAF placement determination. For example, an SRAF seed map includes local-minimum interference distribution (including intensity and coordinates), local-maximum interference distribution (including intensity and coordinates), and noise (including intensity and coordinates). The local-maximum interference distribution may be referred to as the peak interference distribution and the local-minimum interference distribution may be referred to as the valley interference distribution. In some instances, both the peak interference distribution and the valley interference distribution include components extending parallel to adjacent mask features and the noise may include components extending perpendicular to adjacent mask features. Further processes are therefore needed to eliminate or reduce a level of the noise and enhance the signal strength of the peak interference distribution and the valley interference distribution. In some embodiments, high-pass filtering, bandpass filtering, or low-pass filtering may be used to remove noise and enhance the resolution of the peak interference distribution and the valley interference distribution. If the noise level is not reduced, SRAFs that extend perpendicular from the mask features may result. Such SRAFs do not improve accuracy and may also introduce defects in the aerial image. An SRAF map includes not only the placement positions of the SRAFs but also polygonal shapes of the SRAFs. Therefore, further processes are also needed to determine the polygonal shapes and dimensions of the SRAFs. For example, after an SRAF seed map is filtered to remove noise and enhance resolution, polygonal shapes of suitable dimensions may be placed on or around the peaks in the filtered SRAF seed map. The process or processes to determine the polygonal shapes and dimensions of the SRAFs may also be referred to as process(es) to grow SRAFs. Based on the foregoing, such further processes include operations to reduce noise and operations to superposition polygonal shapes based on the peak interference distribution the valley interference distribution, in some embodiments.

Non-ideal characteristic of real-world masks are also considered in the SRAF map calculation according to some embodiments of the present disclosure. An ideal mask includes an infinitely small thickness and is capable of completely blocking the incident radiation. Due to complete blockage of the incident radiation and the infinitely small thickness, a radiation amplitude passing through the ideal mask includes a step function. Where the ideal mask blocks the incident radiation, the radiation amplitude drops to zero (0%). Where the ideal mask allows the incident radiation through the mask opening, the radiation amplitude increases to the full amplitude (100%) of the incident radiation.

However, in reality, a mask has at least a finite thickness and does not have completely block the radiation. In some instances, a real-world mask may be disposed on a glass substrate. The finite thickness and non-ideal radiation blockage capability of the real-world mask may result in a non-ideal radiation amplitude. These non-ideal characteristics may be summarily referred to as the mask three-dimensional (3D) effect. While the above explanation is applied to transmissive masks, similar ideal and non-ideal behaviors may be observed on reflective masks as well. An ideal reflective mask includes perfectly reflective patterns defined on a perfectly absorptive surface. In addition, radiation is reflected only on a very top surface and does not penetrate into the mask. A real-world reflective mask includes partially reflective patterns defined on a partially absorptive surface. In terms of penetration, radiation may penetrate to a depth of one or more layers on a real-world reflective mask and may be reflected by a layer other than the topmost layer.

As radiation is an electromagnetic wave, the mask 3D effect may be calculated using the Maxwell Equations, which include the Gauss's law:

$$\left(\nabla \cdot E = \frac{\rho}{\varepsilon_0}\right),$$

Gauss's law for magnetism ($\nabla \cdot B = 0$), Maxwell-Faraday equation $$\left(\nabla \times E = -\frac{\delta B}{\delta t}\right),$$

Ampere's circuital law $$\nabla \times B = \mu_0 \left(J + \varepsilon_0 \frac{\delta E}{\delta t}\right).$$

In some embodiments, the mask 3D effect may be approximated using a simplified solution to the Maxwell Equations. For example, although the SRAFs placed on a mask may contribute to the mask 3D effect too, their contribution to the mask 3D effect is smaller than that of the main mask pattern. A simplified solution to the Maxwell Equations may drop off the mask 3D effect contributed by the SRAFs. This simplification may greatly reduce the complexity of calculating the mask 3D effect. A solution or a simplified solution to the Maxwell Equation may be used to modify the mask function such that the mask 3D effect is considered. The mask 3D effect may be expressed as one or more functions M. In some implementations, the mask 3D effect may be decomposed into an X-X diffraction component ($M_{xx}$), an X-Y diffraction component ($M_{xy}$), a Y-X diffraction component ($M_{yx}$), and a Y-Y diffraction component ($M_{yy}$).

In some embodiments, the original mask design is assumed to be implemented as a real-world mask impacted by the mask 3D effect and its mask function may be expressed as ($a^M(x,y)$). The mask function ($a^M(x,y)$) includes an X-X component ($a^{Mxx}(x, y)$), an X-Y component ($a^{Mxy}(x, y)$), a Y-X component ($a^{Myx}(x, y)$), and a Y-Y component ($a^{Myy}(x, y)$). The X-X component ($a^{Mxx}(x, y)$), the X-Y component ($a^{Mxy}(x, y)$), the Y-X component ($a^{Myx}(x, y)$), and the Y-Y component ($a^{Myy}(x, y)$) may be obtained by taking Fourier Transform of the corresponding diffraction components:

$$a^{Mxx}(x,y) = FT(M_{xx}),$$

$$a^{Mxy}(x,y) = FT(M_{xy}),$$

$$a^{Myx}(x,y) = FT(M_{yx}),$$

$$a^{Myy}(x,y) = FT(M_{yy}),$$

Unlike their counterparts for an assumed ideal mask, the X-X component, X-Y component, Y-X component, and Y-Y component of the mask function $a^M(x, y)$ are not identical to one another and are separately considered.

Based on the SRAF seed map, at block S112 of FIG. 2, one or more SRAF patterns are placed around the original mask pattern as shown in FIG. 6D. In some embodiments, when the SRAF placement location indicated by the SRAF seed map is closer to the original pattern than a threshold distance, no SRAF is placed at such a location. In some embodiments, the threshold is determined based on one or more of the pattern size of the original pattern, a distance to an adjacent pattern, an optical condition including a resolution limit, and/or a value in the SRAF seed map. Similarly, in some embodiments, when the SRAF placement location indicated by the SRAF seed map is too far from the original pattern (farther than a threshold distance), no SRAF is placed at such a location.

In some embodiments, the SRAF patterns are placed at locations where the value in the SRAF seed map is positive (indicating improvement of image quality). In other embodiments, the SRAF patterns are placed at locations where the value in the SRAF seed map is equal to or greater than a threshold value.

The combination of the original pattern and the SRAF patterns is output as a modified mask layout design. In some embodiments, the SRAF patterns in the SRAF map are placed on the original mask design by super-positioning the SRAF map onto the original mask design to obtain the modified mask layout design.

Then, in some embodiments, an additional OPC operation is performed atbMock 114 of FIG. 2. This additional OPC operation is optional and in some embodiments it is not performed.

Further, at block S116 of FIG. 2, a mask rule check operation is performed to determine whether any of the patterns including the original mask patterns and the SRAF patterns violates the design rule, e.g., the minimum distance (separation), the minimum dimension, etc. If any violation is found, the violating pattern(s) is automatically or manually modified.

Next, the final mask layout design is fixed, the mask design is output for manufacturing a photo mask at block S118 of FIG. 2, and a photo mask is manufactured according to the mask design.

FIGS. 7A-7D show SRAF calculation results according to other embodiments. In FIG. 7A, the parameters of the lithography tool are: a wavelength of the source radiation=13.5 nm; a numerical aperture=0.33; no polarization; an annular illumination; and no lens aberration. The parameters also include application of the mask 3D effect, and a photo resist stack structure. The original mask pattern is a 50 nm square island pattern (a hole pattern in a bright field). Unlike the case of a high NA illumination and polarization as shown in FIG. 6D, which shows circular or frame-shape SRAF patterns, in the case of a low NA illumination and no polarization, the SRAF are discontinuous arc-shape patterns disposed around the original pattern.

In FIG. 7B, the parameters of the lithography tool are: a wavelength of the source radiation=193 nm; a numerical aperture=1.35; TE (transverse electric) polarization; quadrupole illumination; and no lens aberration. The parameters also include application of the mask 3D effect, and a photo resist stack structure. The original mask pattern is a 50 nm square island pattern (a hole pattern in a bright field). Unlike the cases of annular illumination as shown in FIGS. 6B and 7A, in the case of quadrupole illumination, some of the SRAF patterns are arc-shaped convex toward the original pattern.

In FIG. 7C, the parameters of the lithography tool are: a wavelength of the source radiation=13.5 nm; a numerical aperture=0.33; no polarization; quadrupole illumination; and no lens aberration. The parameters also include application of the mask 3D effect, and a photo resist stack structure. The original mask pattern is a 50 nm square island pattern (a hole pattern in a bright field). In the case of quadrupole illumination with a low NA, discontinuous SRAF patterns are disposed around the original pattern.

In FIG. 7D, the parameters of the lithography tool are: a wavelength of the source radiation=193 nm; a numerical aperture=1.35; TE polarized illumination; annular illumination; and no lens aberration. The parameters also include application of the mask 3D effect, and a photo resist stack structure. The original mask pattern is an OPCed pattern of an L-shaped pattern. Serif patterns are added to the corners of the L-shape pattern. The original L-haped pattern has a width of 50 nm, a longer side of 300 nm and a shorter side of 135 nm in a bright field). FIG. 7D shows SRAF patterns for the original L-shape (white) and the OPCed L-shape (gray). By performing an OPC before calculating the SRAF seed map (and placing the SRAF patterns), different SRAF patterns are obtained.

FIG. 8A shows a flowchart of a method of making a semiconductor device, and FIGS. 8B, 8C, 8D and 8E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 8A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802 of FIG. 8A, a photo resist layer is formed over the target layer, as shown in FIG. 8B. The photo resist layer is sensitive to the radiation from the exposing source during a subsequent photolithography exposing process. The photo resist layer may be formed over the target layer by spin-on coating or other suitable techniques. The coated photo resist layer may be further baked to drive out solvent in the photo resist layer.

At S803 of FIG. 8A, the photoresist layer is patterned using an optical lithography tool. In some embodiments, the optical lithography tool is an ArF or a KrF excimer laser scanner using a transmissive mask as shown in FIG. 8C. The transmissive mask includes SRAF patterns as explained above. In other embodiments, the optical lithography tool is an EUV scanner using a reflective mask including SRAF patterns, as shown in FIG. 8D. During the exposing process, the integrated circuit (IC) design pattern defined on the mask is imaged to the photoresist layer to form a latent pattern thereon, without printing the SRAF patterns. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

At S804 of FIG. 8A, the target layer is patterned utilizing the patterned photoresist layer as an etching mask, as shown in FIG. 8E. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8F.

Figures 9A, 9B:
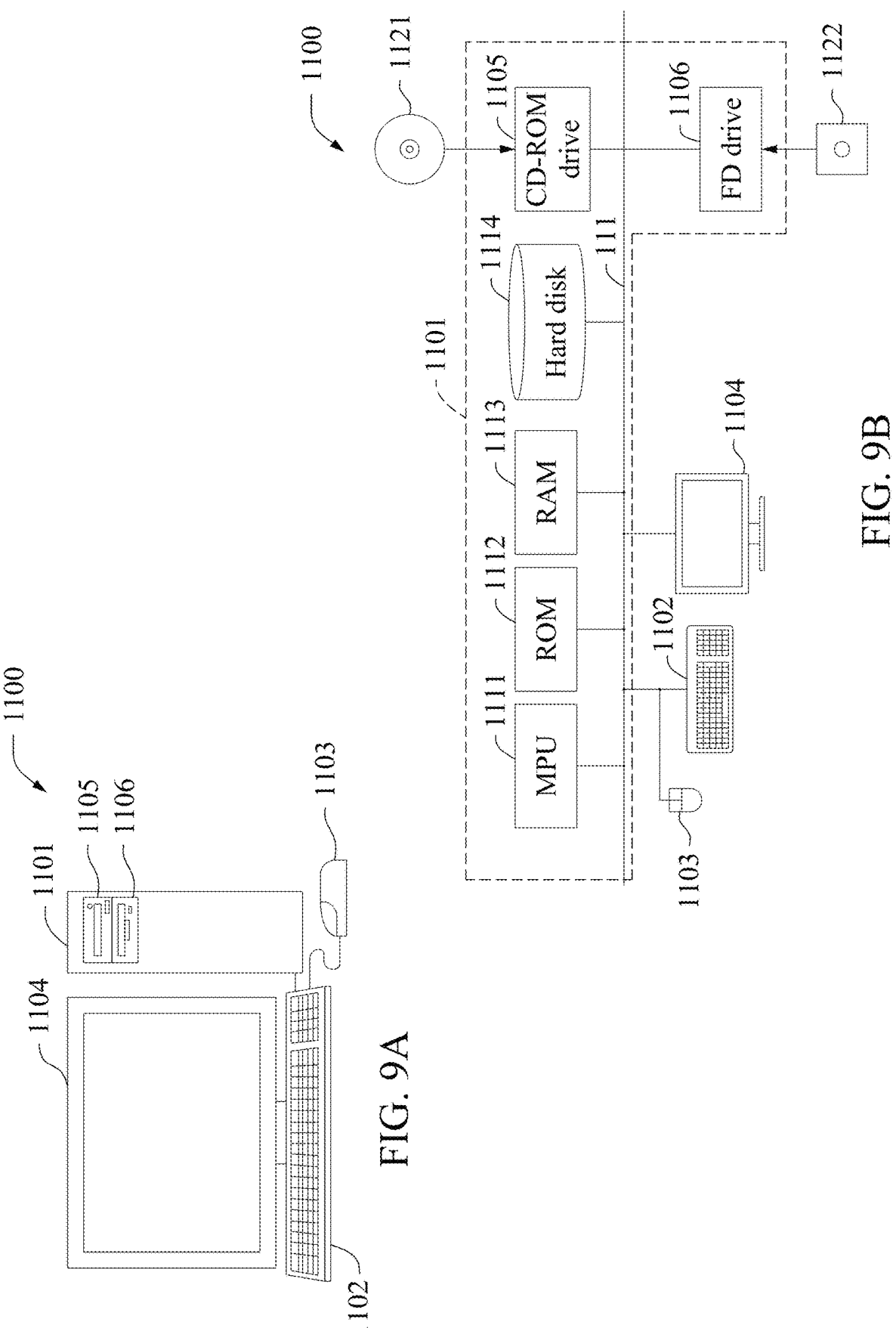
FIGS. 9A and 9B illustrate an apparatus for manufacturing a lithographic mask for a semiconductor circuit in accordance with some embodiments of the disclosure.

FIGS. 9A and 9B illustrate an apparatus for manufacturing a lithographic mask for a semiconductor circuit in accordance with some embodiments of the disclosure. In some embodiments, the apparatus is an optical simulator.

FIG. 9A is a schematic view of a computer system that executes the process for manufacturing the lithographic mask according to one or more embodiments as described above. All of or a part of the processes, method and/or operations of the foregoing embodiments can be realized using computer hardware and computer programs executed thereon. The operations include OPC correction, TCC kernel calculation, SRAF seed map calculation, SRAF placement, etc., as set forth above. In FIG. 9A, a computer system 1100 is provided with a computer 1101 including an optical disk read only memory (e.g., CD-ROM or DVD-ROM) drive 1105 and a magnetic disk drive 1106, a keyboard 1102, a mouse 1103, and a monitor 1104.

FIG. 9B is a diagram showing an internal configuration of the computer system 1100. The computer 1101 is provided with, in addition to the optical disk drive 1105 and the magnetic disk drive 1106, one or more processors 1111, such as a micro processing unit (MPU), a ROM 1112 in which a program, such as a boot up program is stored, a random access memory (RAM) 1113 that is connected to the MPU 1111 and in which a command of an application program is temporarily stored and a temporary storage area is provided, a hard disk 1114 in which an application program, a system program, and data are stored, and a bus 1115 that connects the MPU 1111, the ROM 1112, and the like. Note that the computer 1101 may include a network card (not shown) for providing a connection to a LAN.

The program for causing the computer system 1100 to execute the process for calculating the SRAF seed map and placing the SRAF patterns in the foregoing embodiments may be stored in an optical disk 1121 or a magnetic disk 1122, which are inserted into the optical disk drive 1105 or the magnetic disk drive 1106, and transmitted to the hard disk 1114. Alternatively, the program may be transmitted via a network (not shown) to the computer 1101 and stored in the hard disk 1114. At the time of execution, the program is loaded into the RAM 1113. The program may be loaded from the optical disk 1121 or the magnetic disk 1122, or directly from a network. The program does not necessarily have to include, for example, an operating system (OS) or a third party program to cause the computer 1101 to execute the process for manufacturing the lithographic mask of a semiconductor device in the foregoing embodiments. The program may only include a command portion to call an appropriate function (module) in a controlled mode and obtain desired results.

The embodiments of the present disclosure offer advantages over existing art, though it is understood that other embodiments may offer different advantages, not all advantages are necessarily discussed herein, and that no particular advantage is required for all embodiments. By including all order of the eigenvalues and eigenfunctions of TCC in the calculation of a kernel, methods according to embodiments of the present disclosure consider exposure conditions of the exposure tool, including illumination intensity of the exposure tool, a numerical aperture of the exposure tool, a depth of focus (DOF), a thickness of a resist stack to be patterned, or a range of an aberration. In addition, methods of the present disclosure may include diffraction components to address polarization due to the mask three-dimensional (3D) effect. Because of the consideration of the exposure conditions and the mask 3D effect, methods of the present disclosure have better accuracy than conventional rule-based SRAF placement techniques. In addition, using the image slope as a factor to determine the locations of SRAF patterns, it is possible to more effectively place the SRAF patterns, which improves overall lithography quality. The present embodiments further can improve the image quality of specific locations because the input mask and target can be different. For example, if a weak spot (may be called as hot spot) is found, a heavy weight is put around the weak spot to improve the image quality specifically at that point. Since the present embodiments involve in image calculation with/without a unit pattern and the image quality improvement is qualitatively evaluated, a SRAF seed map qualitatively shows the SRAF impact on target. In this way, it is possible to clearly know which SRAF location(s) is/are more important than the other locations. An additional benefit includes that it is possible to specify an image slope to be improved. While it may be possible to empirically know that an improving image intensity could improve an image slope (indirectly), in the present embodiments, a SRAF location which helps to improve an image slope is directly shown.

In accordance with one aspect of the present disclosure, in a pattern formation method for a semiconductor device fabrication, an original pattern for manufacturing a photomask is acquired, a modified original pattern is obtained by performing an optical proximity correction on the original pattern, a sub-resolution assist feature (SRAF) seed map with respect to the modified original pattern indicating locations where an image quality is improved by an SRAF pattern is obtained, SRAF patterns are placed around the original pattern, the SRAF patterns and the modified original pattern are output as mask data, and the photo mask is manufactured using the mask data. In one or more of the foregoing and following embodiments, another optical proximity correction is performed on the SRAF patterns and the modified original pattern. The mask data include the SRAF patterns and the modified original pattern on which the another optical proximity correction is performed. In one or more of the foregoing and following embodiments, a design rule check operation is performed on the SRAF patterns and the modified original pattern. In one or more of the foregoing and following embodiments, one or more of the SRAF patterns or the modified original pattern is modified after the design rule check operation. In one or more of the foregoing and following embodiments, when the SRAF seed map is obtained, locations where placement of a unit pattern improves an image quality of the modified original pattern are found. In one or more of the foregoing and following embodiments, the image quality comprises a image slope of an edge of the modified original pattern. In one or more of the foregoing and following embodiments, the unit pattern is a square having a size of 2 nm to 40 nm.

In accordance with another aspect of the present disclosure, in a pattern formation method, an original pattern for manufacturing a photomask is acquired, a sub-resolution assist feature (SRAF) seed map is calculated to find candidate locations where placing a pattern improves an image slope of an edge of an optical image of the original pattern, SRAF patterns are placed at one or more of the candidate locations, the SRAF patterns and the modified original pattern are output as mask data, the photo mask is manufactured using the mask data, and a resist pattern is formed by an optical lithography using the photo mask. In one or more of the foregoing and following embodiments, the calculating the SRAF seed map comprises calculating the SRAF seed map according to the following formula:

$$t(x',y') = \iint [I_x(x,y;x',y') + I_y(x,y;x',y')] dx dy,$$

where $$t(x', y') = \iint [I_x(x, y; x', y') + I_y(x, y; x', y')] dx dy,$$

where $$FT[I_x(x, y; x', y')] =$$

-continued $$FT\left[h(x, y)\frac{\partial W(x, y)}{dx}\right][i2\pi f\Phi_i(f, g)]^* + FT\left[h_x(x, y)\frac{\partial W(x, y)}{dx}\right]\Phi_i^*(f, g),$$

$$FT[I_y(x, y; x'y')] =$$

$$FT\left[h(x, y)\frac{\partial W(x, y)}{dy}\right][i2\pi g\Phi_i(f, g)]^* + FT\left[h_y(x, y)\frac{\partial W(x, y)}{dy}\right]\Phi_i^*(f, g),$$

$$h(x, y) = FT^{-1}[\Phi_i(f, g)\hat{a}(f, g)],$$

$$h_x(x, y) = FT^{-1}[i2\pi f\Phi_i(f, g)\hat{a}(f, g)],$$

$$h_y(x, y) = FT^{-1}[i2\pi g\Phi_i(f, g)\hat{a}(f, g)],$$

$\lambda_i$ is the i-th eigenvalue of a transmission cross coefficient (TCC), $\Phi_i$ is the i-th eigenfunction of a TCC, W(x, y) expresses lens aberration, and $\Phi_i$=FT[$\phi_i$](FT is Fourier Transform).

In one or more of the foregoing and following embodiments, a modified original pattern is obtained by performing an optical proximity correction on the original pattern. The SRAF seed map is obtained with respect to the modified original pattern. In one or more of the foregoing and following embodiments, another optical proximity correction is performed on the SRAF patterns and the modified original pattern. The mask data include the SRAF patterns and the modified original pattern on which the another optical proximity correction is performed. In one or more of the foregoing and following embodiments, a design rule check operation is performed on the SRAF patterns and the modified original pattern. In one or more of the foregoing and following embodiments, in the SRAF seed map, locations having a positive value indicate the candidate locations. In one or more of the foregoing and following embodiments, one or more locations having the positive value are selected, and the SRAF patterns are placed at the selected locations. No SRAF pattern is placed at least one of the locations having the positive value, which is not selected.

In accordance with another aspect of the present disclosure, an apparatus for manufacturing a photo mask includes a processor, and a non-transitory computer readable storage medium storing a program. The program, when executed by the processor, causes the processor to perform: acquiring an original pattern for manufacturing a photomask; calculating a sub-resolution assist feature (SRAF) seed map to find candidate locations where placing a pattern improves an image slope of an edge of an optical image of the original pattern; placing SRAF patterns at one or more of the candidate locations; and outputting the SRAF patterns and the modified original pattern as mask data. In one or more of the foregoing and following embodiments, the calculating the SRAF seed map comprises calculating the SRAF seed map according to the following formula:

$$t(x',y')=\iint[I_x(x,y;x',y')+I_y(x,y;x',y')]dxdy,$$

where $$t(x', y') = \iint[I_x(x, y; x', y') + I_y(x, y; x', y')]dxdy,$$

where $$FT[I_x(x, y; x', y')] =$$

$$FT\left[h(x, y)\frac{\partial W(x, y)}{dx}\right][i2\pi f\Phi_i(f, g)]^* + FT\left[h_x(x, y)\frac{\partial W(x, y)}{dx}\right]\Phi_i^*(f, g),$$

-continued $$FT[I_y(x, y; x', y')] =$$

$$FT\left[h(x, y)\frac{\partial W(x, y)}{dy}\right][i2\pi g\Phi_i(f, g)]^* + FT\left[h_y(x, y)\frac{\partial W(x, y)}{dy}\right]\Phi_i^*(f, g),$$

$$h(x, y) = FT^{-1}[\Phi_i(f, g)\hat{a}(f, g)],$$

$$h_x(x, y) = FT^{-1}[i2\pi f\Phi_i(f, g)\hat{a}(f, g)],$$

$$h_y(x, y) = FT^{-1}[i2\pi g\Phi_i(f, g)\hat{a}(f, g)],$$

$\lambda_i$ is the i-th eigenvalue of a transmission cross coefficient (TCC), $\Phi_i$ is the i-th eigenfunction of a TCC, W(x, y) expresses lens aberration, and $\Phi_i$=FT[$\phi_i$](FT is Fourier Transform).

In one or more of the foregoing and following embodiments, the executed program further causes the processor to perform obtaining a modified original pattern by performing an optical proximity correction on the original pattern, and the SRAF seed map is obtained with respect to the modified original pattern. In one or more of the foregoing and following embodiments, the executed program further causes the processor to perform performing another optical proximity correction on the SRAF patterns and the modified original pattern, and the mask data include the SRAF patterns and the modified original pattern on which the another optical proximity correction is performed. In one or more of the foregoing and following embodiments, the executed program further causes the processor to perform selecting one or more locations, but not all locations, of the candidate locations indicated in the SRAF seed map. In one or more of the foregoing and following embodiments, the selecting the one or more locations is performed based on a distance from the original pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method for a semiconductor device fabrication, comprising:

acquiring an original pattern for manufacturing a photomask;

obtaining a modified original pattern by performing an optical proximity correction on the original pattern;

obtaining a sub-resolution assist feature (SRAF) seed map with respect to the modified original pattern indicating locations where an image quality is improved by an SRAF pattern;

placing SRAF patterns around the original pattern;

performing a design rule check operation on the SRAF patterns and the modified original pattern;

outputting the SRAF patterns and the modified original pattern as mask data; and manufacturing a photo mask using the mask data, wherein obtaining the SRAF seed map comprises finding locations where placement of a unit pattern improves an image quality of the modified original pattern, wherein the image quality comprises an image slope of an edge of the modified original pattern.

2. The pattern formation method of claim 1, further comprising performing another optical proximity correction on the SRAF patterns and the modified original pattern, wherein the mask data include the SRAF patterns and the modified original pattern on which the another optical proximity correction is performed.

3. The pattern formation method of claim 1, wherein one or more of the SRAF patterns or the modified original pattern is modified after the design rule check operation.

4. The pattern formation method of claim 1, wherein the unit pattern is a square having a size of 2 nm to 40 nm.

5. The pattern formation method of claim 1, wherein in the SRAF seed map, locations having a positive value indicate locations for the SRAF patterns.

6. The pattern formation method of claim 5, further comprising selecting one or more locations having the positive value, and placing the SRAF patterns at the selected locations, wherein no SRAF pattern is placed at at least one of the locations having the positive value, which is not selected.

7. The pattern formation method of claim 1, the placement of the unit pattern is performed according to a mesh or a matrix surrounding the original pattern.

8. The pattern formation method of claim 1, the wherein the image quality further comprises a contrast, an intensity, or a focus tolerance.

9. A pattern formation method for a semiconductor device fabrication, comprising:

acquiring an original pattern for manufacturing a photomask;

calculating a sub-resolution assist feature (SRAF) seed map to find candidate locations where placing a SRAF improves an image slope of an edge of an optical image of the original pattern, wherein calculating the SRAF seed map comprises calculating the SRAF seed map according to a following formula:

$$t(x', y') = \int\int [I_x(x, y; x', y') + I_y(x, y; x', y')]dxdy,$$

where $$FT[I_x(x, y; x', y')] =$$

$$FT\left[h(x, y)\frac{\partial W(x, y)}{dx}\right][i2\pi f\Phi_i(f, g)]^* + FT\left[h_x(x, y)\frac{\partial W(x, y)}{dx}\right]\Phi_i^*(f, g),$$

$$FT[I_y(x, y; x', y')] =$$

$$FT\left[h(x, y)\frac{\partial W(x, y)}{dy}\right][i2\pi g\Phi_i(f, g)]^* + FT\left[h_y(x, y)\frac{\partial W(x, y)}{dy}\right]\Phi_i^*(f, g),$$

$$h(x, y) = FT^{-1}[\Phi_i(f, g)\hat{a}(f, g)],$$

$$h_x(x, y) = FT^{-1}[i2\pi f\Phi_i(f, g)\hat{a}(f, g)],$$

$$h_y(x, y) = FT^{-1}[i2\pi g\Phi_i(f, g)\hat{a}(f, g)],$$

$\lambda_i$ is an i-th eigenvalue of a transmission cross coefficient (TCC), $\Phi_i$ is an i-th eigenfunction of a TCC, W(x, y) expresses lens aberration, and $\Phi_i=FT[\varphi_i]$, where FT is Fourier Transform;

placing SRAF patterns at one or more of the candidate locations;

outputting the SRAF patterns and the original pattern as mask data;

manufacturing a photo mask using the mask data; and forming a resist pattern by an optical lithography using the photo mask.

10. The pattern formation method of claim 9, further comprising obtaining a modified original pattern by performing an optical proximity correction on the original pattern, wherein the SRAF seed map is obtained with respect to the modified original pattern.

11. The pattern formation method of claim 10, further comprising performing another optical proximity correction on the SRAF patterns and the modified original pattern, wherein the mask data include the SRAF patterns and the modified original pattern on which the another optical proximity correction is performed.

12. The pattern formation method of claim 11, further comprising performing a design rule check operation on the SRAF patterns and the modified original pattern.

13. The pattern formation method of claim 12, wherein one or more of the SRAF patterns or the modified original pattern is modified after the design rule check operation.

14. The pattern formation method of claim 9, wherein in the SRAF seed map, locations having a positive value indicate the candidate locations.

15. The pattern formation method of claim 14, further comprising selecting one or more locations having the positive value, and placing the SRAF patterns at the selected locations, wherein no SRAF pattern is placed at at least one of the locations having the positive value, which is not selected.

16. An apparatus for manufacturing a photo mask comprising:

a processor; and a non-transitory computer readable storage medium storing a program, wherein:

the program, when executed by the processor, causes the processor to perform:

acquiring an original pattern for manufacturing a photomask;

calculating a sub-resolution assist feature (SRAF) seed map to find candidate locations where placing a SRAF improves an image slope of an edge of an optical image of the original pattern, wherein calculating the SRAF seed map comprises calculating the SRAF seed map according to a following formula:

$$t(x', y') = \int\int [I_x(x, y; x', y') + I_y(x, y; x', y')]dxdy,$$

where $$FT[I_x(x, y; x', y')] =$$

$$FT\left[h(x, y)\frac{\partial W(x, y)}{dx}\right][i2\pi f\Phi_i(f, g)]^* + FT\left[h_x(x, y)\frac{\partial W(x, y)}{dx}\right]\Phi_i^*(f, g),$$

$$FT[I_y(x, y; x', y')] =$$

$$FT\left[h(x, y)\frac{\partial W(x, y)}{dy}\right][i2\pi g\Phi_i(f, g)]^* + FT\left[h_y(x, y)\frac{\partial W(x, y)}{dy}\right]\Phi_i^*(f, g),$$

$$h(x, y) = FT^{-1}[\Phi_i(f, g)\hat{a}(f, g)],$$

-continued $$h_x(x, y) = FT^{-1}[i2\pi f\Phi_i(f, g)\hat{a}(f, g)],$$

$$h_y(x, y) = FT^{-1}[i2\pi g\Phi_i(f, g)\hat{a}(f, g)],$$

$\lambda_i$ is an i-th eigenvalue of a transmission cross coefficient (TCC), $\Phi_i$ is an i-th eigenfunction of a TCC, W(x, y) expresses lens aberration, and $\Phi_i$=FT[$\phi_i$], where FT is Fourier Transform;

placing SRAF patterns at one or more of the candidate locations; and outputting the SRAF patterns and the original pattern as mask data.

17. The apparatus of claim 16, wherein:

the executed program further causes the processor to perform obtaining a modified original pattern by performing an optical proximity correction on the original pattern, and the SRAF seed map is obtained with respect to the modified original pattern.

18. The apparatus of claim 17, wherein:

the executed program further causes the processor to perform another optical proximity correction on the SRAF patterns and the modified original pattern, and the mask data include the SRAF patterns and the modified original pattern on which the another optical proximity correction is performed.

19. The apparatus of claim 16, wherein the executed program further causes the processor to perform selecting one or more locations, but not all locations, of the candidate locations indicated in the SRAF seed map.

20. The apparatus of claim 19, wherein the selecting the one or more locations is performed based on a distance from the original pattern.

\* \* \* \* \*